United States Patent [19]

Tanielian et al.

[11] Patent Number: 4,526,665
[45] Date of Patent: Jul. 2, 1985

[54] METHOD OF DEPOSITING FULLY REACTED TITANIUM DISILICIDE THIN FILMS

[75] Inventors: Minas Tanielian, Schaumburg; Scott Blackstone, Mt. Prospect; Robert Lajos, Crystal Lake, all of Ill.

[73] Assignee: Gould Inc., Rolling Meadows, Ill.

[21] Appl. No.: 642,328

[22] Filed: Aug. 20, 1984

[51] Int. Cl.³ .............................................. C23C 15/00
[52] U.S. Cl. ............................ 204/192 C; 204/192 R; 204/192 S
[58] Field of Search ............. 204/192 C, 192 R, 192 S

[56] References Cited

U.S. PATENT DOCUMENTS

| | | | |
|---|---|---|---|
| 4,218,291 | 8/1980 | Fukuyama et al. | 204/192 SP |
| 4,322,453 | 3/1982 | Miller | 204/192 SP |
| 4,348,263 | 9/1982 | Draper et al. | 204/192 C |
| 4,424,101 | 1/1984 | Nowicki | 204/192 C |
| 4,466,875 | 8/1984 | Gillery | 204/298 |
| 4,468,308 | 8/1984 | Scovell et al. | 204/192 C |

OTHER PUBLICATIONS

Angilello et al., J. Elect. Mater. 10, (1981), #1, pp. 59–93.

Primary Examiner—Arthur P. Demers
Attorney, Agent, or Firm—Edward E. Sachs; G. P. Edgell; J. R. Garrett

[57] ABSTRACT

The subject invention is a method of sputtering a material on a substrate in which the substrate is first locally heated so that the mobility on the surface of the substrate is increased to a value $E_S$. A material is then sputtered on the substrate with a sputtering energy $E_k$ whereby the sum of $E_k$ and $E_s$ is greater than the activation energy required for a chemical reaction to occur between the sputtered surface of the substrate and the sputtered material. In the preferred embodiment, the substrate is silicon and the material to be sputtered is a refractory metal such as titanium.

26 Claims, 5 Drawing Figures

METHOD OF DEPOSITING FULLY REACTED TITANIUM DISILICIDE THIN FILMS

BACKGROUND OF THE INVENTION

The deposition and processing of refractory metal silicides has become the topic of many recent investigations due to their vital role in the future of very large scale integration (VLSI) technology. Initially, silicide films were intended to be used for the gate metallization in metal/oxide/semiconductor (MOS) devices. The next generation of silicide films will be used to shunt not only the gates of the MOS devices but the source and drain region as well, thus reducing their resistance. Silicide film structures for both the gate as well as the source and drain can be done in principle in a single processing step, giving rise to the process labelled self-aligned silicide formation. The self-aligned silicide formation process is done in a furnace sintering step by reacting the refractory metal film with the polysilicon film on top of the gate oxide and the bulk silicon at the source and drain regions, to form the refractory metal silicide film. The unreacted metal on the sidewalls is subsequently stripped away in a preferential etch that will not attack the silicide film. A serious problem with this technique as conventionally practiced relates to the fact that the diffusing species during the formation of many refractory metal silicides is silicon. Thus, during a sintering step at elevated temperatures which is required to form the desired silicide film, some silicide may form at the gate sidewall which will not strip in a preferential etch. This can result in an electrical short between the gate and the source and drain regions.

$TiSi_2$ is a suitable refractory metal silicide for self-aligned silicide applications for two reasons. One, it is the most conductive of all the refractory metal silicides. And two, it has the lowest temperature of formation. At the same time, however, there are problems associated with the sintering step between Ti and Si. Ti happens to be extremely sensitive to oxidation and this prevents the formation of high quality films. Also, some out-diffusion of the dopant from the source and drain regions through the silicide may take place because of the high temperatures involved in the sintering step, thus leaving high resistance shallow junctions.

Along another vein, in addition to the desire to be able to deposit a refractory metal to form a high-quality refractory-metal silicide, a need exists to be able to form high quality epitaxial silicon layers on silicon substrates as well as to be able to form high-quality oxides and nitrides on silicon substrates for a variety of purposes. The subject invention proposes a way to sputter such layers in an efficient fashion and in a manner in which the formed layers are of a relatively high quality.

SUMMARY OF THE INVENTION

An object of the invention is to be able to form titanium silicide on a silicon substrate in which the titanium silicide is fully reacted without the necessity of annealing or sintering the substrate after titanium or titanium silicide has been deposited on the substrate.

Another object of the subject invention is to be able to form a self-aligned MOS device in which the refractory metal is fully reacted to form a silicide without the necessity of annealing the MOS device after sputtering.

Another object of the subject invention is to provide an improved sputtering method which is relatively efficient in operations in which a chemical reaction is required between a sputtered material and the surface of a substrate.

Another object of the subject invention is to provide an improved sputtering method in which the substrate on which a material is to be sputtered is locally heated during sputtering.

The subject invention can be summarized as a method of depositing a material onto the surface of a substrate. The invention includes the steps of heating a substrate to increase the mobility of the sputtered species on the surface of the substrate to an energy level $E_s$ and sputtering the substrate with a sputtering material having a kinetic energy $E_k$. The sum of $E_k$ and $E_s$ is sufficiently large to allow either: a chemical reaction to occur between the substrate and the sputtered material, a chemical reaction to occur between the sputtered material and a reactive gas present during sputtering; or an epitaxial layer to be formed on the surface of the substrate.

DETAILED DESCRIPTION OF THE INVENTION

Figure 1:
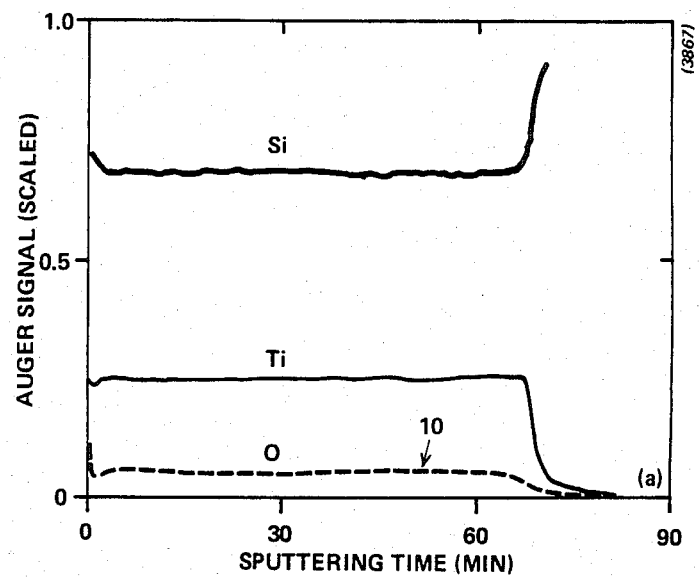
FIG. 1 is an Auger depth profile of a room-temperature deposited film of titanium silicide from a composite $TiSi_{2.1}$ target.

As discussed above in the summary, the gist of the invention is that a substrate can be locally heated to increase the mobility of the species on a surface of the substrate during sputtering to promote certain desirable reactions to occur. This technique represents a novel approach over the prior art because prior-art sputtering was limited to substrate temperatures typically below 400° C.

Using the technique described herein, it is possible to heat the substrate to temperatures in a much higher range such as from 450° C. to 650° C. to allow a variety of desired reactions to occur. This technique is particularly applicable to magnetron sputtering techniques in which the sputtered material has a relatively high energy and is deposited at a relatively high rate. This is because the subject invention takes advantage of the enhanced mobility on the surface of the substrate due to the bombardment of the surface by the deposited species.

It is important to note that the formation of a reacted film during the deposition using the technique described herein takes advantage of the kinetics of the substrate surface. The average kinetic energy of the deposited species during sputtering is much higher than in either evaporation or chemical vapor deposition where only thermal energies are involved. The average kinetic energy is also a function of the sputtering power. When the sputtered species impinge on the substrate surface, some of their kinetic energy will be transferred to the surface species increasing their surface mobility and diffusivity. This in turn, corresponds to an equivalent surface temperature which is much higher than the bulk temperature of the substrate, thus promoting surface reactions which were only possible at much higher bulk substrate temperatures in the absence of surface bombardment. A manifestation of this effect was observed in the case of titanium silicide films deposited from a composite target and with substrate temperatures above 450° C. In this case, it was possible to obtain fully reacted titanium disilicide films similar to cold-substrate-deposited films that had been annealed at 900° C.

In the preferred embodiment, titanium is sputtered onto a silicon substrate. This embodiment is particularly important due to its applicability in self-aligned MOS structures. In this embodiment, the silicon wafer can be heated to a relatively high temperature typically in the range of 450° C. to 650° C. A titanium layer is sputtered to an approximate thickness of 600 to 1000 angstroms which results in the formation of a silicide layer of about 1000 to 2000 angstroms. By heating the substrate to a relatively high temperature, the titanium fully reacts with the underlying silicon during deposition to produce titanium silicide. The typical temperature at which fully reacted titanium disilicide is formed is above 500° C. The technique described herein represents an advantage over the prior art. This is because prior art titanium-deposition techniques previously required at least one annealing step to react the titanium with the underlying silicon. Another advantage over the prior art has to do with the purity of the titanium film. The technique described herein produces films which are oxygen free, oxidation resistant, and polycrystalline.

The reason for the exclusion of the oxygen from the growing silicide film seems to relate to the thermodynamics and phase equilibrium properties of the Ti-Si-O system according to some recent studies by the inventors. The formation of a titanium disilicide phase excludes the oxygen out of the growing film such that the only oxygen present is segregated in the form of $SiO_2$ on the surface of the titanium disilicide film.

In another embodiment of the subject invention, the sputtered material may be a composite of refractory metal and silicon. In a similar embodiment a refractory metal and silicon may be co-sputtered from separate targets onto a heated silicon substrate. In all of the above embodiments, the refractory metal can consist of titanium, tantalum, molybdenum, niobium, and tungsten. The refractory metal will react with the available silicon to form a silicide. This technique can be useful to form IC interconnects.

In another embodiment of the subject invention, silicon may be the sputtered material. In this type of embodiment, silicon would typically be sputtered onto a silicon substrate whose sputtering surface has been locally heated. The sputtered silicon will form a thin epitaxial layer of silicon. This embodiment has the advantage over the prior art because it can be done at bulk substrate temperatures which can be several hundred degrees lower than conventionally required.

The ability to grow epitaxial silicon on silicon or other substrate materials is of extreme technological importance. This is because such ability, in the case of epitaxial silicon on silicon, could prove to be useful for forming abrupt junctions in the underlayers of silicon devices. In the case of silicon on other substrates, one could possibly grow large-grain polysilicon on an insulator for applications in silicon on insulator (SOI) device technology.

In yet another embodiment of the subject invention, a substrate is locally heated, and a material is sputtered thereon in the presence of a reactive gas. For instance, silicon may be sputtered in the presence of oxygen or nitrogen to form good quality silicon oxide or nitride that could not be done according to prior art techniques for comparable bulk substrate temperatures. In a similar embodiment, a metal is used as the sputtering material in the presence of oxygen or nitrogen to form a metal oxide or nitride.

The ability to form a high quality silicon oxide is desirable as the intermetal dielectric in multilevel metal interconnects for integrated circuits. The ability to form high-quality metal oxides is desirable in a variety of applications such as dielectric insulation, and the ability to form high quality metal nitrides is desirable in barrier metal layers to prevent aluminum spiking in contact holes.

EXAMPLES

In one example, the films were sputtered in a bell-jar chamber which was fitted with two 2" DC magnetron sputter guns. The target was a cold-pressed target from Varian with a nominal composition of $TiSi_{2.1}$. The system was pumped down to $3 \times 10^{-7}$ Torr before each deposition and then backfilled with ultra high purity argon to a pressure of about 3 mTorr. In order to clean the target and getter any background oxygen in the system, the target was presputtered for approximately an hour with the shutter closed before the deposition of the film. The substrates were (111), 10 ohm cm, bare silicon wafers. The heating of the wafers was done using a Mo resistor fabricated on the oxidized back of the wafers. This heating technique was chosen because it minimized the heating of other parts and fixtures in the sputtering chamber, which could degas and produce unwanted background gases. Using this technique it is possible to reproducibly heat the wafer between ambient and 650° C. The substrate temperature was measured on the front side of the wafer using a thin wire thermocouple via a spring contact. The sheet resistance of the films was measured using a four point probe and the thickness was obtained from a Dektak II stylus probe. The Auger signals were calibrated using $TiSi_2$ powder samples.

When the properties of a film deposited at 600° C. substrate temperature were compared to those of a film deposited on an unheated substrate, it was possible to find significant differences. The resistivity of the film deposited at room temperature was about 750 micro-ohm cm. Annealing produced a decrease in resistivity to about 20 micro-ohm cm. These numbers are typical of what has been reported in the literature.

On the other hand, the resistivity of the film deposited at 600° C. was 20 micro-ohm cm as deposited, and it did not change after the annealing cycle. This fact provides strong evidence that the film deposited using these elevated temperatures is fully reacted and requires no annealing.

X-ray diffraction data of the as-deposited film at room temperature and at 600° C. before and after annealing were taken. The room temperature as-deposited film appears to be amorphous. After annealing, a strong reflection due to the (004) $TiSi_2$ plane is observed indicating that the anneal has made the film polycrystalline with a preferred orientation, since no other strong peaks were discernable.

On the other hand, the 600° C. as deposited film is already crystalline and further annealing does not produce any changes. A noteworthy observation is that in all cases a preferred orientation was present (004) in the crystallized films independent of how the sample was crystallized. SEM examination of the as-deposited room-temperature film both before and after annealing showed a columnar structure on an otherwise smooth background with a feature size of about 1000 angstroms. Similarly, the as-deposited 600° C. film both before and after anneal was unchanged; however, it looked quite different in structure. The grain size was much larger, on the order of 6000–8000 angstroms, and as a result, it looked cloudy under visual observation.

Figure 2:
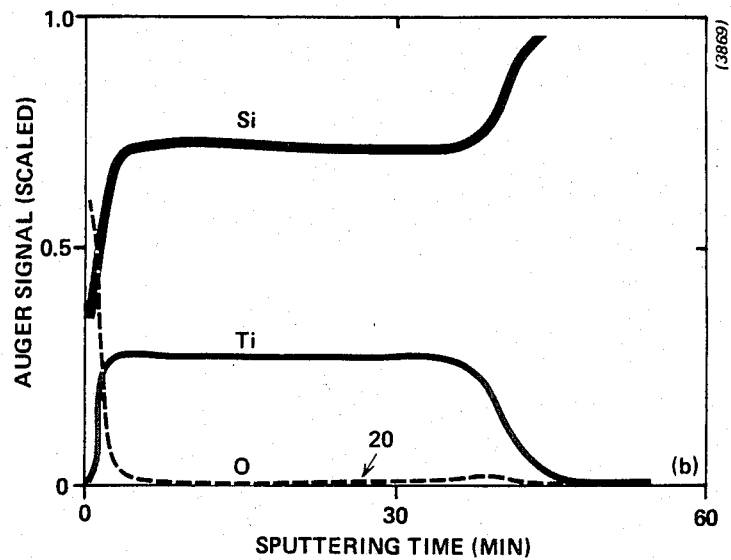
FIG. 2 is an Auger depth profile for 600° C. substrate temperature deposited film of titanium silicide from a composite $TiSi_{2.1}$ target (showing the exclusion of oxygen)
Figure 3:
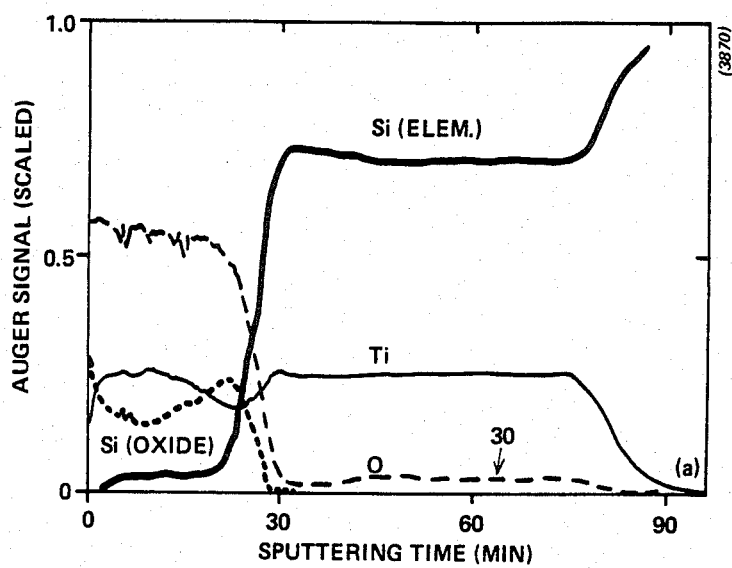
FIG. 3 is an Auger depth profile of the sample in FIG. 1 that has been subsequently annealed at 900° C. for 30 minutes in argon.
Figure 4:
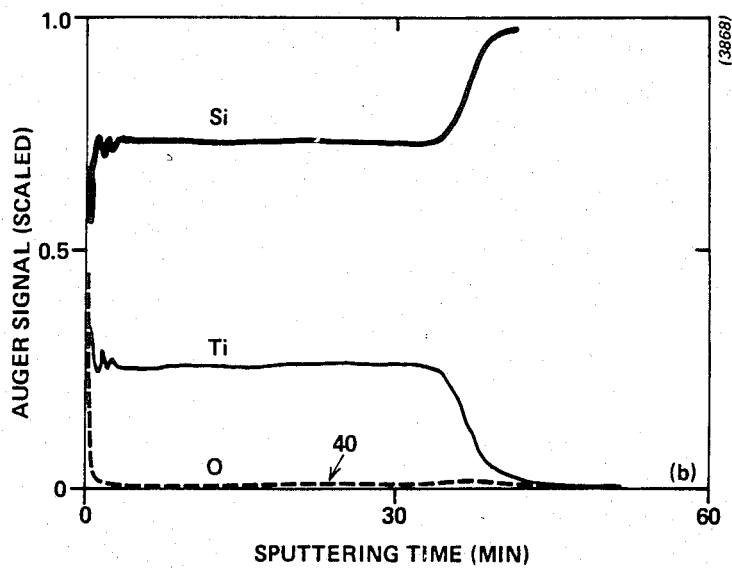
FIG. 4 is an Auger depth profile of the sample in FIG. 2 that has been subsequently annealed at 900° C. for 30 minutes in argon.

Auger depth profiles were done on all the samples. The Auger profiling was done using Xe in order to detect any argon present in the films. However, no argon was detected in any of the films under the highest sensitivity of our system, which is about 0.1 atomic percent. Several authors have reported 1–5 atomic percent oxygen in titanium silicide films due to the high affinity of titanium for oxygen. As can be seen in 10 FIG. 1, this happens to be true in our room-temperature, as-deposited film, too. However, the as-deposited 600° C. film of 20 FIG. 2 has very little oxygen present in it. It is believed that the exclusion of the oxygen is due to the segregation of the contaminants from the reacted $TiSi_2$ film. In addition, this fully reacted film is more oxidation resistant than the room temperature deposited film as is seen by the results 30, 40 of FIGS. 3 and 4. In the room temperature film, annealing converted the top third of the film into a mixture of titanium, silicon and their respective oxides, while the oxide present on the surface of the 600° C. substrate temperature film, both before and after anneal is $SiO_2$. This fact is highly desirable from a processing point of view. It is also consistent with a recent study which shows that the only stable oxide that can co-exist with $TiSi_2$ is $SiO_2$ from thermodynamic phase diagram calculations.

Figure 5:
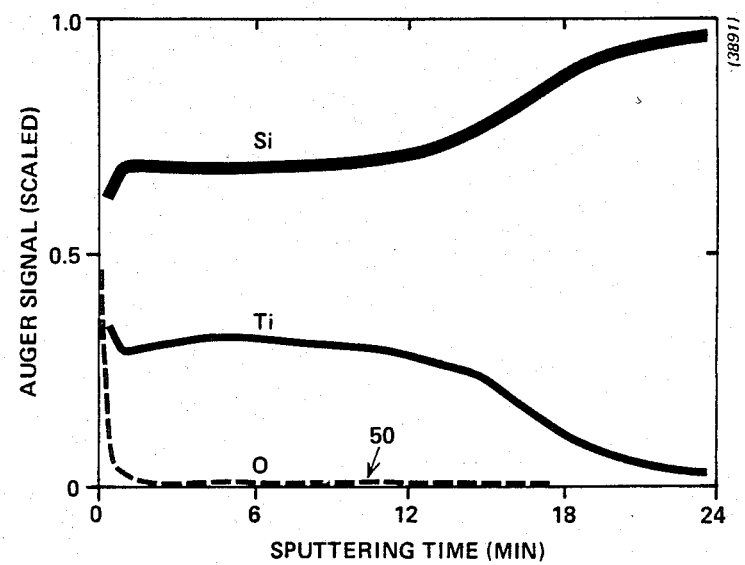
FIG. 5 represents an Auger depth profile of titanium sputtered onto a silicon wafer at a substrate temperature of 515° C.

In a second example, titanium was sputtered on a silicon wafer at a substrate temperature of 515° C. Approximately 600 angstroms of titanium was deposited on the wafer. The resulting film was a matte shiny surface with a resistivity of 15 micro-ohm cm which is the lowest value reported for a titanium disilicide film. The film thickness was assumed to be the thickness measured after etching a step in an HF etch, which was 1000 angstroms. An Auger depth profile 50 of the as-deposited film is given in FIG. 5. As can be seen, the resulting film is not a titanium film on silicon but a titanium silicide film with an approximate composition of $TiSi_2$. Furthermore, the film contains no Auger detectable oxygen or carbon. Titanium silicide, and titanium films deposited in this system onto room temperature substrates typically show 5–7 atomic percent oxygen incorporation. After the deposition, the film was placed in a selective titanium etch ($NH_4OH/H_2O_2$/-$H_2O$: 1/1/5 at 85° C.) and the thickness was remeasured. This resulted in no loss of film thickness indicating that the entire titanium film was consumed by the growing titanium silicide film during deposition. Further, annealing of this film at 900° C. for 30 minutes, in argon, resulted in no change in resistivity or thickness. A subsequent Auger depth profile showed no changes except for some $SiO_2$ growth on the surface.

Although the invention has been described and illustrated in detail, it is to be clearly understood that the same is by way of illustration and example only, and is not to be taken by way of limitation; the spirit and scope of this invention being limited only by the terms of the appended claims.

We claim:

1. A method of depositing a refractory metal on a surface of a silicon substrate to form a refractory metal silicide comprising the steps of:
   heating said surface of said substrate to increase the mobility on the surface of the substrate to an energy level $E_s$; and
   sputtering said substrate with a refractory metal having a kinetic energy $E_k$ whereby the sum of $E_k$ and $E_s$ is greater than the activation energy required for a refractory metal silicide to be formed.

2. A method of depositing a refractory metal as recited in claim 1 wherein said substrate is heated to a temperature in the range of 450° C. to 650° C.

3. A method of depositing a refractory metal as recited in claim 2 wherein said refractory metal is titanium.

4. A method of depositing a refractory metal as recited in claim 1 wherein said refractory metal is titanium.

5. A method of depositing a refractory metal as recited in claim 1 wherein said refractory metal is tantalum.

6. A method of depositing a refractory metal as recited in claim 2 wherein said refractory metal is tantalum.

7. A method of depositing a refractory metal as recited in claim 1 wherein said refractory metal is molybdenum.

8. A method of depositing a refractory metal as recited in claim 2 wherein said refractory metal is molybdenum.

9. A method of depositing a refractory metal as recited in claim 1 wherein said heating of said surface of said substrate further comprises:
   forming a resistor on one side of said substrate; and
   passing a current through said resistor to cause said substrate to be heated so that said surface of said substrate can be subjected to said sputtering of said refractory metal.

10. A method of depositing a refractory metal as recited in claim 9 wherein said metal is titanium.

11. A method of depositing a refractory metal as recited in claim 10 wherein said resistor is a thin-film resistor and said current to said resistor is sufficient to heat said surface of said substrate to a temperature range of 450° C. to 650° C.

12. A method of depositing a refractory metal as recited in claim 1 wherein said heating step further comprises: directing a high-intensity light source onto said substrate to cause said substrate to be heated.

13. A method of depositing a refractory metal as recited in claim 12 wherein said refractory metal is titanium and said surface of said substrate is heated to a temperature range of 450° C. to 650° C.

14. A method of depositing a refractory metal as recited in claim 1 wherein said heating step further comprises:
   flowing a high-temperature inert gas on a surface of said substrate opposite said surface to which said refractory metal is sputtered to heat said substrate.

15. A method of depositing a combination of a refractory metal and silicon on a substrate comprising the steps of:

heating said substrate to increase the mobility of said substrate surface to an energy level $E_s$;

sputtering said substrate with said refractory metal and said silicon having a kinetic energy $E_k$ whereby the sum of $E_k$ and $E_s$ is greater than the activation energy required for a refractory metal silicide to be formed.

16. A method of depositing a combination of a refractory metal and silicon as recited in claim 15 wherein said sputtering step further comprises:

co-sputtering said substrate with separate targets, one target being said silicon and another target being said refractory metal.

17. A method of depositing a combination of a refractory metal and silicon as recited in claim 16 wherein said refractory metal is titanium.

18. A method of depositing a combination of a refractory metal and silicon as recited in claim 15 wherein said sputtering step further comprises:

sputtering said substrate with a composite target of a mixture of silicon and a refractory metal.

19. A method of depositing a combination of a refractory metal and silicon as recited in claim 18 wherein said refractory metal is titanium.

20. A method of depositing a material on a surface of a substrate comprising the steps of:

heating said substrate to increase the mobility of said substrate surface to an energy level $E_s$; and sputtering in the presence of a reactive gas said substrate with said material, said material having a kinetic energy $E_k$ whereby the sum of $E_k$ and $E_s$ is greater than the activation energy required for a chemical reaction to occur on said surface of said substrate and said sputtered material.

21. A method of depositing a material as recited in claim 20 wherein said material is silicon, said reactive gas is oxygen, and said substrate is silicon to form $SiO_2$.

22. A method of depositing a material as recited in claim 20 wherein said material is a metal and said reactive gas is oxygen to form a metal oxide on said substrate.

23. A method of depositing a material as recited in claim 20 wherein said material is silicon, said reactive gas is nitrogen, and said substrate is silicon to form silicon nitride.

24. A method of depositing a material as recited in claim 20 wherein said material is a metal and said reactive gas is nitrogen to form a metal nitride on said substrate.

25. A method of depositing a silicon layer on a surface of a silicon substrate to form an epitaxial layer of silicon comprising the steps of:

heating said substrate to increase the mobility of the substrate surface to an energy level $E_s$; and sputtering said substrate with silicon having a kinetic energy $E_k$ whereby the sum of $E_k$ and $E_s$ is greater than the activation energy required for an epitaxial layer of silicon to be formed.

26. A method of depositing a refractory metal on a source gate and drain region of a field effect transistor fabricated on a silicon substrate to form a self-aligned MOS transistor comprising the steps of:

sputtering said source gate and drain regions with said refractory metal having a kinetic energy $E_k$; and heating said substrate to increase the mobility of said sputtered material on the outer surface of said source, gate and drain regions to an energy level $E_s$ whereby the sum of $E_k$ and $E_s$ is greater than the activation energy required for a refractory metal silicide to be formed on the surface of said source, gate and drain regions.

* * * * *